(12) United States Patent
Hwang et al.

(10) Patent No.: US 6,335,287 B1
(45) Date of Patent: Jan. 1, 2002

(54) METHOD OF FORMING TRENCH ISOLATION REGIONS

(75) Inventors: Hong-kyu Hwang, Suwon; Bo-un Yoon, Seoul; Kyu-hwan Chang, Hwasung-gun; Sang-rok Hah, Seoul, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/637,788

(22) Filed: Aug. 11, 2000

(30) Foreign Application Priority Data

Aug. 13, 1999 (KR) .............................. 99-33354

(51) Int. Cl.⁷ .................... H01L 12/302; H01L 21/304; H01L 21/3065; H01L 31/311
(52) U.S. Cl. ...................... 438/692; 438/700; 438/706; 438/745
(58) Field of Search ............... 438/692, 700, 438/745, 706

(56) References Cited

U.S. PATENT DOCUMENTS

| | | | | |
|---|---|---|---|---|
| 5,177,028 A | * | 1/1993 | Manning | 438/289 |
| 5,362,669 A | * | 11/1994 | Boyd et al. | 438/437 |
| 5,933,748 A | * | 8/1999 | Chou et al. | 438/431 |

* cited by examiner

Primary Examiner—Felisa Hiteshew
Assistant Examiner—Lynette T. Umez-Eronini
(74) Attorney, Agent, or Firm—Volentine Francos, PLLC

(57) ABSTRACT

To form isolation trenches on a semiconductor substrate, chemical mechanical polishing (CMP) stopping patterns are formed on the substrate, and the substrate is then etched using the CMP stopping patterns as a mask. Then an insulating material is deposited to fill the trenches and cover the CMP stopping patterns. The insulating material is etched using a CMP process until the CMP stopping patterns become exposed, and is then etched using a wet or dry etching process. The wet or dry etching is continued until protruding insulating material above a surface of the substrate is a predetermined thickness, which corresponds to an amount of the insulating material that is etched during removal of the CMP stopping patterns and during intermediate processes prior to formation of a gate oxide layer.

17 Claims, 3 Drawing Sheets

METHOD OF FORMING TRENCH ISOLATION REGIONS

BACKGROUND OF THE INVENTION

1. Field of the Invention

The present invention relates to a method for manufacturing a semiconductor device, and more particularly, to a method of forming trench isolation regions in a semiconductor substrate.

2. Description of the Related Art

As the degree of integration of semiconductor devices increases, research has become more active in the fabrication of shallow trench isolation (STI) regions which exhibit excellent isolation characteristics even though they are smaller than more conventional local oxidation of silicon (LOCOS) regions. Generally, STI regions are fabricated by forming a trench in an isolation region of a semiconductor substrate, filling the trench with an insulating material, and planarizing the resultant surface by chemical mechanical polishing (CMP).

According to current planarizing processes employing CMP, complete planarization is not achieved due to a step difference in an insulating material layer extending between an active region where patterns are highly integrated (such as a cell array region or a peripheral circuit region) and a field region where few patterns exist. This step difference results from a difference in pattern densities between the two regions. Also, "dishing" occurs in wide isolation regions due to a bending characteristic of the pad of the CMP equipment. (Herein, "dishing" refers to an inward sloping of the material to form a shallow dish-like configuration.) The result is a final product having step differences which are not uniform over the entire wafer.

Excess polishing (i.e., over-polishing) is performed by CMP in an attempt to planarize the entire wafer, namely, to prevent the occurrence of the step difference between the finally formed isolation layer and the semiconductor substrate of the active region. At this time, the step difference between the isolation layer and the semiconductor substrate in the region where the patterns are integrated is different than the step difference between the isolation layer and the semiconductor substrate in the region where the patterns are not integrated. This results from the characteristic of the CMP process where the amount of etching varies according to the pattern density. The variation of the step difference remains after the isolation layer is formed and after all processes of forming a gate oxide layer (for example, a cleaning process) are performed, thus lessening the planarization of the entire surface of the wafer and causing a phenomenon where the electrical performance of the semiconductor device is not uniform over the entire wafer.

FIGS. 1 through 5 are sectional views for sequentially describing the processes of a general method for forming trench isolation regions.

Figure 1:
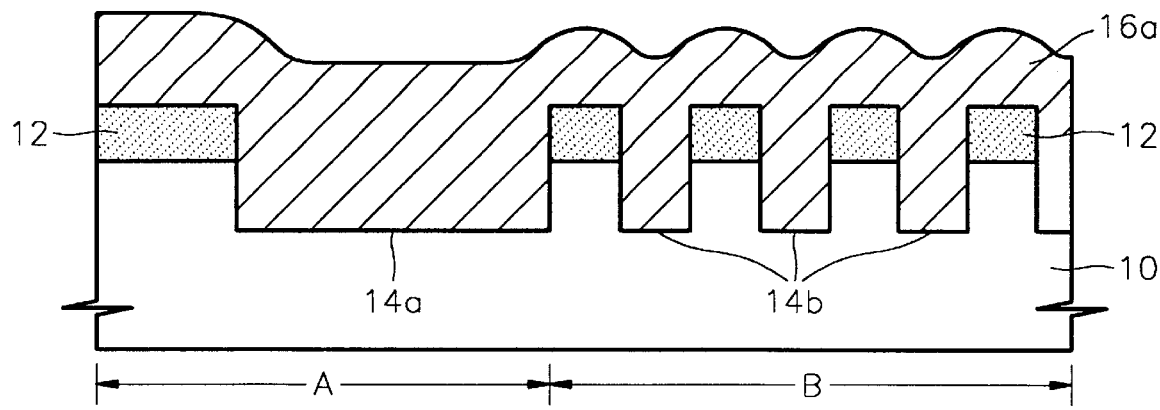

Referring to FIG. 1, a CMP stopping layer (which forms CMP stopping patterns 12) is formed on a semiconductor substrate 10. The CMP stopping layer is then patterned to form CMP stopping patterns 12 which define windows therebetween for exposing the respective isolation regions. The semiconductor substrate 10 is then etched to a predetermined depth using the stopping patterns 12 as a mask. In this way, a wide trench 14a and narrow trenches 14b are formed in a field region A and a pattern region B, respectively. An insulating material layer 16a is then formed by depositing an insulating material of a suitable thickness to completely fill the trenches 14a and 14b and to cover the CMP stopping patterns 12.

Figure 2:
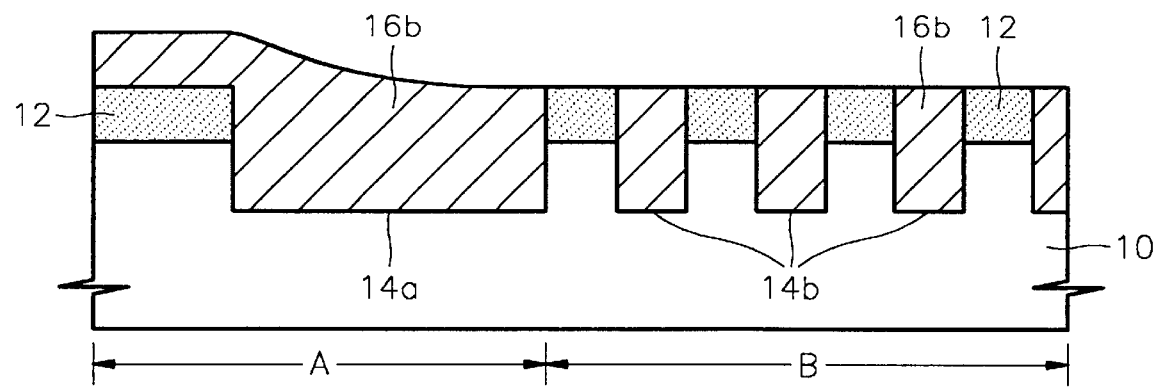
Figure 3:
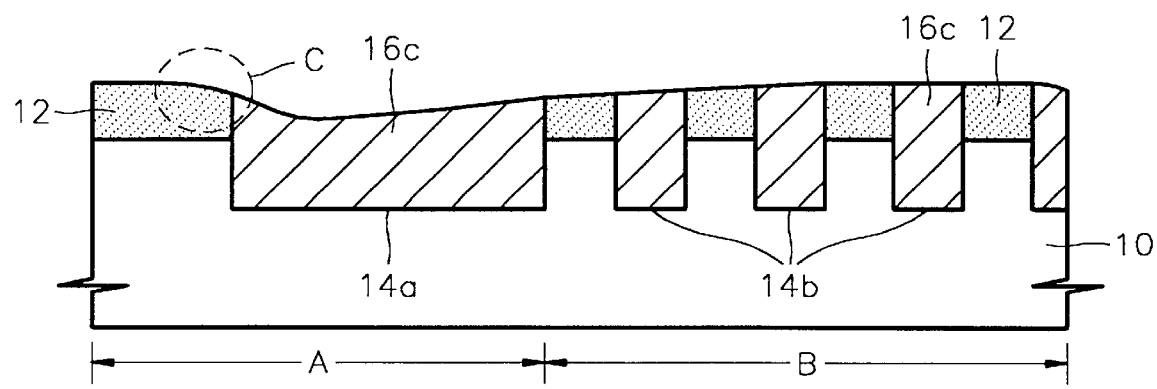
Figure 4:
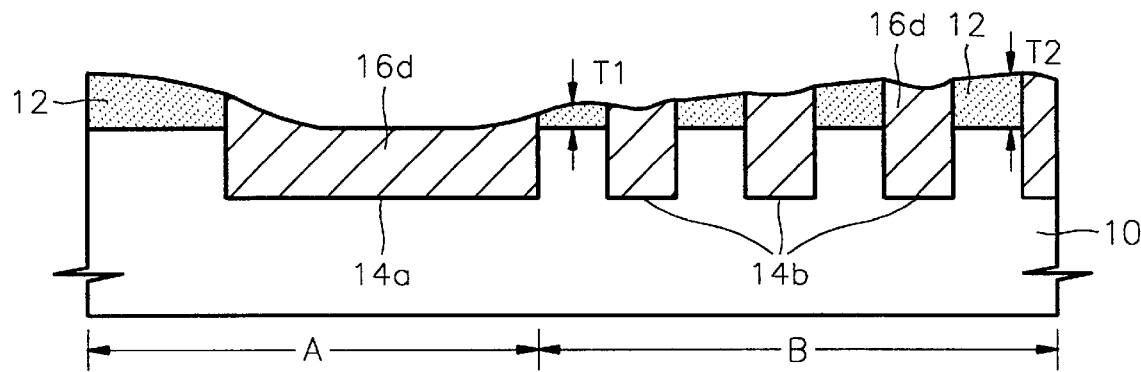

FIGS. 2 through 4 are sectional views for illustrating the manner in which the thicknesses of the insulating material layer and the CMP stopping patterns 12 change as the CMP process proceeds. FIG. 2 shows the etched configuration of an insulating material layer 16b before the CMP stopping patterns 12 are completely exposed by the CMP process. FIG. 3 shows the etched configurations of an insulating material layer 16c and the CMP stopping patterns 12 when the CMP stopping patterns 12 are completely exposed by the CMP process. FIG. 4 shows the etched configurations of an insulating material layer 16d and the CMP stopping patterns 12 when the CMP stopping patterns 12 are excessively etched by the CMP process.

Referring again to FIG. 2, the insulating material layer 16b stacked on the CMP stopping patterns 12 around the wide trench 14a (of the region A) is not completely removed, and the insulating material layer 16b stacked on the CMP stopping patterns 12 around the narrow trenches 14b (of the region B) begins to expose the CMP stopping patterns 12. At this time, the CMP process is not affected by the density of the CMP stopping patterns 12, and instead the CMP process is affected only by the step difference of the initially coated insulating material layer (16a of FIG. 1).

Referring to FIG. 3, since the insulating material layer stacked on the CMP stopping patterns 12 are completely removed from the regions A and B, namely, since the CMP process is further performed until the insulating material layer (16b of FIG. 2) stacked on the CMP stopping patterns 12 around the wide trench 14a (of the region A) is completely removed, the CMP stopping patterns 12 around the wide trench is completely exposed and the CMP stopping patterns 12 around the narrow trenches are etched by a predetermined thickness. Accordingly, the heights of the CMP stopping patterns 12 around the narrow trenches are reduced.

At this time, the height of the CMP stopping patterns 12 (marked "C") adjacent to the wide trench 14a is reduced to the heights of the CMP stopping patterns 12 around the narrow trenches, and the amount of etching of the CMP stopping patterns 12 is larger toward the wide trench 14a in the pattern region B. This is because the CMP stopping patterns 12 formed around the wide trench 14a are etched more than the CMP stopping patterns 12 formed in other regions due to a dishing phenomenon which occurs in the wide trench 14a formed in the field region A resulting from the CMP process being characteristically affected by the density of the pattern.

The CMP stopping patterns 12 are formed of a material which is etched less by the CMP process than a material which forms the insulating material layer (16c of FIG. 3). During the CMP process, the region (the pattern region B) where the CMP stopping patterns are integrated is etched less than the region (the field region A) where the CMP stopping patterns are not integrated. Namely, the insulating material layer filled in the narrow trenches 14b is protected by the CMP stopping patterns 12 therearound. On the other hand, the insulating material layer filled in the wide trench 14a is not as protected by the CMP stopping patterns 12 therearound, and therefore the insulating material layer which fills the wide trench 14a is etched more quickly.

The CMP process, which is initially affected only by the density of the pattern, becomes affected by the bending characteristic of the pad as well as the density of the pattern as the CMP process proceeds further. Accordingly, the difference in the amount of etching of the insulating material layers between the two regions A and B becomes larger. As a result, the dishing phenomenon occurs resulting in a more severe bending of the surface of the insulating material layer 16d filled in the wide trench 14a. Further, the thicknesses of the CMP stopping patterns 12 are not uniform over the entire wafer since the CMP stopping pattern around the wide trench 14a is etched more than the CMP stopping patterns of other regions.

FIG. 4 is a sectional view showing the case where the CMP process is further performed in an attempt to planarize the finally formed isolation layer (the isolation layer before the formation of a gate oxide layer) and the semiconductor substrate 10. As can be seen, the dishing phenomenon and the phenomenon where the thicknesses of the CMP stopping patterns 12 are not uniform over the entire wafer become more serious. The height T1 of the CMP stopping patterns adjacent to the wide trench 14a is much lower than the height T2 of the CMP stopping pattern 12 in the middle region of the pattern region B which is not adjacent to the wide trench 14a.

When the CMP stopping patterns are removed from the configuration of FIG. 4, the insulating material layer 16d slightly protrudes above the surface of the exposed semiconductor substrate 10. Since the heights of the CMP stopping patterns 12 are not uniform over the entire wafer, the step difference between the insulating material layer 16d and the semiconductor substrate 10 is not uniform over the entire wafer.

Figure 5:
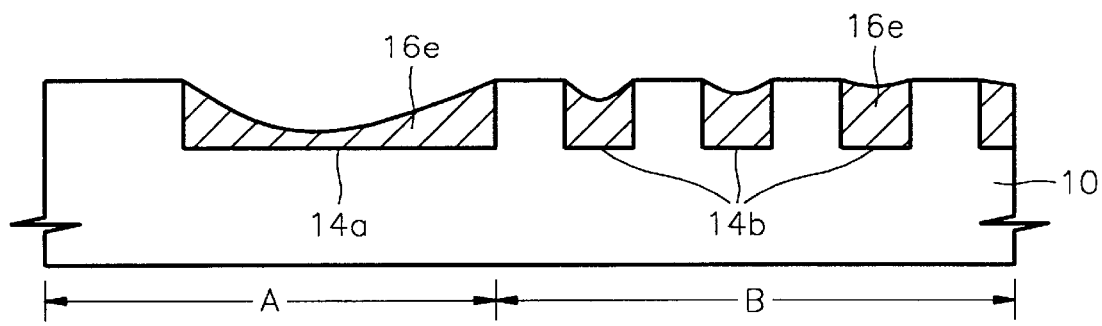

FIG. 5 is a sectional view showing an isolation layer 16e that is finally obtained after removing the CMP stopping patterns and then performing a process such as a cleaning process. That is, FIG. 5 shows the isolation layer 16e right before the formation of the gate oxide layer. The surface of the isolation layer in the wide trench 14a is most severely dished, and the dishing becomes less severe toward the pattern region. The isolation layer 16e in the wide trench 14a and the isolation layer 16e in the narrow trenches 14b are not entirely parallel to the semiconductor substrate 10.

When the subsequent processes of forming the gate oxide layer and the gate electrode are performed in a state where the surface of the isolation layer 16e is not parallel to the surface of the semiconductor substrate 10, electrical characteristics of transistors are not uniform over the entire wafer or are weak in certain regions. Accordingly, the performance of the semiconductor device deteriorates.

SUMMARY OF THE INVENTION

It is an object of the present invention to provide a method of fabricating trench isolation regions in which a trench isolation layer thereof has a planarized surface that is parallel to a surface of a semiconductor substrate.

To achieve the above object, CMP stopping patterns are first formed on a semiconductor substrate. The semiconductor substrate is then etched using the CMP stopping patterns as a mask to form a plurality of trenches in the semiconductor substrate. Then an insulating material layer is deposited so as to fill the trenches and to cover the CMP stopping patterns. The insulating material layer is etched a first time using a CMP process until the CMP stopping patterns become exposed. The insulating material layer is then etched a second time using a wet or dry etching process. Preferably, the wet or dry etching is continued until an amount of the insulating material layer that protrudes above a surface of the semiconductor wafer is reduced to a predetermined thickness, where the predetermined thickness corresponds to an amount of the insulating material layer that is further etched during later removal of the CMP stopping patterns and during any intermediate processes that may be carried out prior to formation of a gate oxide layer.

The CMP stopping patterns are formed of a material which is etched to a lesser degree by the CMP process than is a material which forms the insulating material layer. For example, CMP stopping patterns may be formed of an insulating material such as silicon nitride (SiN) or silicon oxynitride (SiON). Examples of the insulating material layer include one or more layers of undoped silicon glass (USG), silicon glass doped with boron and phosphorus (BPSG), silicon glass doped with phosphorus (PSG), alkoxysilane (TEOS), undoped silicon glass at a high temperature or an HDP oxide layer, which is coated by a chemical vapor deposition (CVD) method, or an oxide layer coated by a spin on glass (SOG) method.

The wet or dry etching is performed under the condition that the CMP stopping patterns are not damaged. In the case of wet etching, an etching solution such as HF or buffered HF may be used.

BRIEF DESCRIPTION OF THE DRAWING(S)

The above object and advantages of the present invention will become more apparent by describing in detail a preferred embodiment thereof with reference to the attached drawings in which:

FIGS. 1 through 5 are sectional views for sequentially describing the processes of a general method for forming trench isolation regions; and FIGS. 6 through 9 are sectional views for sequentially describing the processes of a method for forming trench isolation regions according to an embodiment of the present invention in which an insulating material layer is etched in two processes.

DESCRIPTION OF THE PREFERRED EMBODIMENT

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. Also, the same reference numerals in different drawings represent the same elements, and redundant descriptions of such elements are avoided below.

Briefly, according to the present invention, the process of etching the insulating layer is performed in two steps: a first step of performing a CMP process until a CMP stopping pattern is exposed, and a second step of etching the insulating layer to a required extent using general wet etching or dry etching. As explained herein, this technique overcomes several drawbacks which are encountered when the trench isolation layer is formed by conventional methods.

FIGS. 6 through 9 are sectional views for sequentially describing the processes of a method of forming trench isolation regions according to an embodiment of the present invention.

Figure 6:
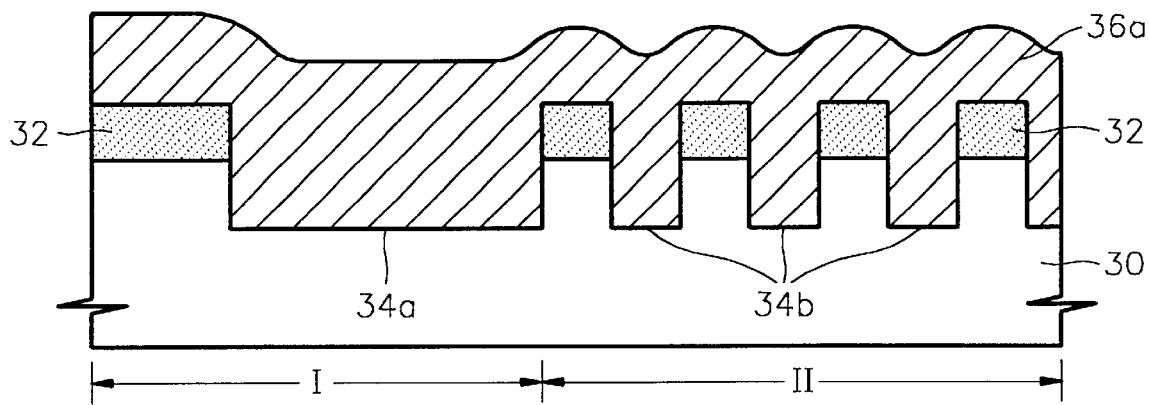

Referring to FIG. 6, a CMP stopping layer (which becomes CMP stopping patterns 32) is formed by coating a semiconductor substrate 30 with an insulating material such as silicon nitride (SiN) or silicon oxynitride (SiON). The CMP stopping layer is then patterned to form CMP stopping patterns 32 which have windows defined therein which expose isolation regions of the semiconductor substrate 30. The semiconductor substrate is then etched by an anisotropic etching using the CMP stopping patterns 32 as a mask. As a result, a wide trench 34a is formed in a field region I and narrow trenches 34b are formed in a pattern region II of the semiconductor substrate 30.

The pattern region II is a region where a pattern density is high, such as a cell array region or a peripheral circuit region. The field region I is a region where the pattern density is lower than in the pattern region II.

The first insulating material layer 36a is formed by depositing one or more insulating material layers to completely fill the trenches 34a and 34b and to cover the CMP stopping patterns 32. Examples of the insulating material layer(s) include undoped silicon glass (USG), silicon glass doped with boron and phosphorus (BPSG), silicon glass doped with phosphorus (PSG), alkoxysilane (TEOS), undoped silicon glass at a high temperature or an HDP oxide layer, which is coated by a chemical vapor deposition (CVD) method, or an oxide layer coated by a spin on glass (SOG) method.

The CMP stopping patterns 32 are formed of a material which is polished to a lesser degree by the CMP process than is a material which forms the first insulating material layer 36a.

Figure 7:
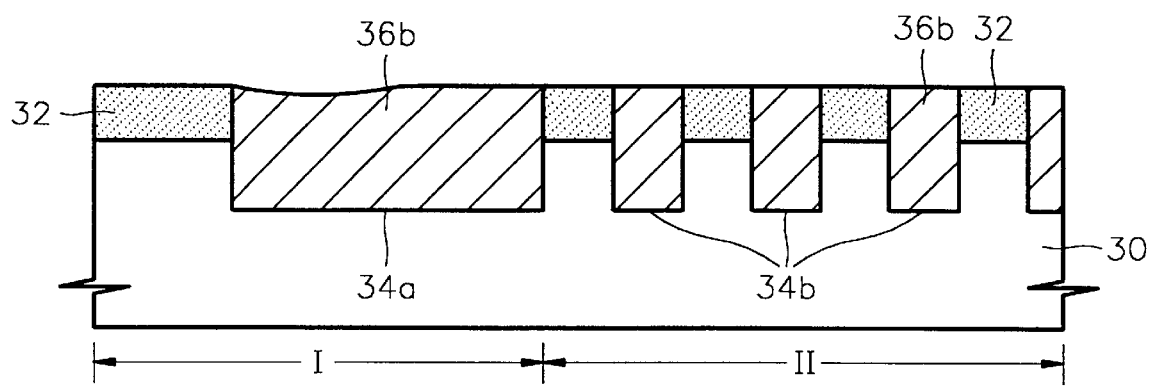

Referring to FIG. 7, the first insulating material layer 36a (FIG. 6) is subjected to CMP until the CMP stopping patterns 32 are exposed to define a second insulating material layer 36b. The second insulating material layer 36b is partially planarized and completely fills the wide trench 34a, the narrow trenches 34b, and the spaces between the CMP stopping patterns 32.

At this time, since the CMP process is stopped at a point where the CMP stopping patterns 32 begin to be exposed, the amount of etching of the CMP stopping patterns 32 is not affected by the pattern density of the CMP stopping patterns 32.

Figure 8:
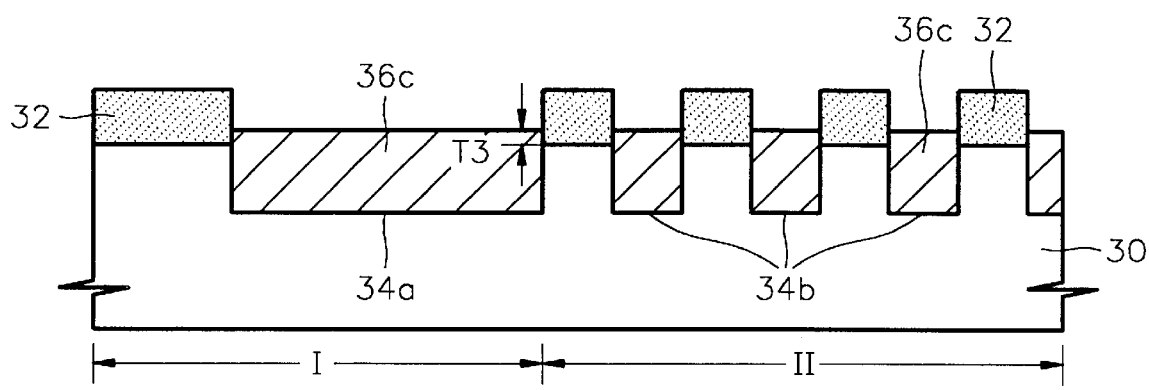

Referring to FIG. 8, the second insulating material layer 36b (FIG. 7) is subjected to wet or dry etching to remove a predetermined portion thereof and thus define a third insulating material layer 36c which fills the trenches 34a and 34b and protrudes above the surface of the semiconductor substrate 30 by a predetermined thickness T3.

Unlike conventional methods, the second insulating material layer 36b of FIG. 7 is etched by dry or wet etching, and not by a continuation of the CMP process. As a result, the phenomena of FIGS. 4 and 5 are avoided where the CMP etching is not uniform over the entire wafer due to the difference in the densities of the CMP stopping patterns, and where the thicknesses of the CMP stopping patterns are not uniform over the entire wafer due to the dishing phenomenon and due to the step difference between the insulating material layer and the semiconductor substrate not being uniform over the entire wafer after performing the CMP process.

The wet or dry etching is performed such that the CMP stopping patterns 32 are not damaged thereby. HF or buffered HF may be used as a wet etching solution.

Thus, referring to FIGS. 7 and 8, the third insulating material layer 36c having a planarized surface is formed by firstly performing the CMP process by which planarization can be easily achieved until the such time the CMP stopping patterns 32 are exposed, and secondly performing overetching by general wet etching or dry etching (whose etch amounts are not affected by the density of the CMP stopping patterns) after the CMP stopping patterns 32 are exposed.

At this time, the thickness T3 by which the third insulating material layer 36c protrudes above the surface of the semiconductor substrate 30 is determined in consideration of an amount of etching that the third insulating material layer 36c will be subjected to prior to formation of a gate oxide layer. For example, the third insulating material layer 36c may be etched during removal of the CMP stopping patterns 32, and/or during an intermediate process (such as a cleaning process) that is performed after removing the CMP stopping patterns 32 and before forming the gate oxide layer. The thickness T3 is the same as the thickness by which the third insulating material layer 36c is etched during these processes.

Figure 9:
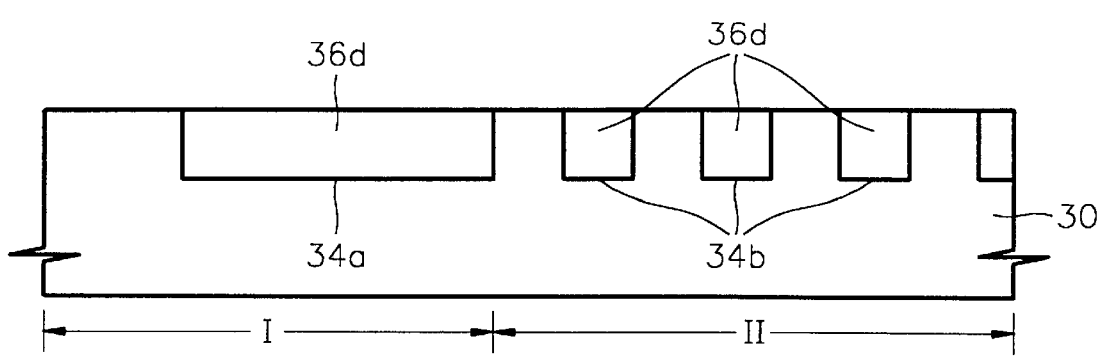

Referring to FIG. 9, an isolation layer 36d is formed by removing the CMP stopping patterns 32 (FIG. 8) using an etching solution such as $H_3PO_4$, and by performing an intermediate process (such as the cleaning process). As such, referring also to FIG. 8, since the thickness T3 by which the third insulating material layer 36c protrudes above the surface of the semiconductor substrate 30 is completely removed (etched) during the process of removing the CMP stopping patterns and/or the intermediate process, there is no step difference between the semiconductor substrate 30 and the isolation layer 36d that is obtained after the intermediate process. The surface of the isolation layer 36d is not dished and the isolation layer 36d is parallel to the semiconductor substrate 30 over the entire wafer. Thus, planarization is achieved.

According to the method of forming isolation trenches of the present invention, it is possible to avoid problems in which the surface of the finally formed isolation layer is dished and in which the isolation layer is not parallel to the semiconductor substrate over the entire wafer, such problems being caused by the difference in the densities of the CMP stopping patterns and by the dishing phenomenon that occurs during the conventional over-CMP process. According to the invention, a CMP process is first performed on the insulating layer until a CMP stopping pattern is exposed, and then wet or dry etching of the insulating layer is performed to a required extent using general wet etching or dry etching, such wet or dry etching not being affected by the density of the exposed stopping patterns. Accordingly, it is possible to planarize the isolation layer over the entire wafer and to make the surface of isolation layer parallel to the surface of the semiconductor substrate.

What is claimed is:

1. A method for forming isolation trenches, comprising:
   forming chemical mechanical polishing (CMP) stopping patterns on a semiconductor substrate;
   etching the semiconductor substrate using the CMP stopping patterns as a mask to form a plurality of trenches in the semiconductor substrate;
   depositing an insulating material layer so as to fill the trenches and to cover the CMP stopping patterns;
   etching the insulating material layer using a CMP process until the CMP stopping patterns become exposed;
   further etching the insulating material layer using a wet or dry etching process, without damaging the CMP stopping patterns; and
   removing the CMP stopping patterns after said further etching.

2. The method of claim 1, further comprising:
   performing an intermediate process on the semiconductor substrate and the insulating material layer, said intermediate process being carried out prior to forming a gate oxide layer on the semiconductor substrate and the insulating material layer.

3. The method of claim 2, wherein said further etching is continued until an amount of the insulating material layer that protrudes above a surface of the semiconductor substrate is reduced to a thickness, and wherein the thickness corresponds to an amount of the insulating material layer that is etched during said removing of the CMP stopping patterns and during said intermediate process.

4. A method for forming isolation trenches, comprising:
   coating a chemical mechanical polishing (CMP) stopping layer on a semiconductor substrate;
   patterning the CMP stopping layer to form a plurality of CMP stopping patterns having windows defined therebetween which expose respective isolation regions of the semiconductor substrate;
   etching the semiconductor substrate using the CMP stopping patterns as a mask to form a plurality of trenches in the respective isolation regions of the semiconductor substrate;
   depositing an insulating material layer so as to fill the trenches and to cover the CMP stopping patterns;
   etching the insulating material layer using a CMP process until the CMP stopping patterns become exposed;
   further etching the insulating material layer using a wet or dry etching process, without damaging the CMP stopping patterns; and
   removing the CMP stopping patterns after said further etching.

5. The method of claim 4, wherein the CMP stopping patterns are formed of a material which is etched to a lesser degree by the CMP process than a material which forms the insulating material layer.

6. The method of claim 5, wherein the CMP stopping patterns are formed of an insulating material.

7. The method of claim 6, wherein the insulating material is silicon nitride (SiN) or silicon oxynitride (SiON).

8. The method of claim 5, wherein the insulating material layer is at least partially formed by chemical vapor deposition of undoped silicon glass, silicon glass doped with boron phosphorus, silicon glass doped with phosphorus, alkoxysilane, or an HDP oxide layer.

9. The method of claim 5, wherein the insulating material layer is at least partially formed by spin on glass coating of an oxide layer.

10. The method of claim 4, wherein said further etching of the insulating material layer is by wet etching using a wet etching solution.

11. The method of claim 10, wherein the wet etching solution is HF or buffered HF.

12. The method of claim 4, further comprising performing an intermediate process on the semiconductor substrate and the insulating material layer after removing the CMP stopping patterns, said intermediate process being carried out prior forming a gate oxide layer on the semiconductor substrate and the insulating material layer.

13. The method of claim 12, wherein said further etching is continued until an amount of the insulating material layer that protrudes above a surface of the semiconductor substrate is reduced to a thickness, and wherein the thickness corresponds to an amount of the insulating material layer that is etched during the removing of the CMP stopping patterns and during said intermediate process.

14. A method for forming isolation trenches in a semiconductor device having a pattern region where pattern density is high and a field region where pattern density is lower than the pattern region, comprising:
   forming chemical mechanical polishing (CMP) stopping patterns on a semiconductor substrate;
   etching the semiconductor substrate using the CMP stopping patterns as a mask to form a plurality of trenches in the semiconductor substrate;
   depositing an insulating material layer so as to fill the trenches and to cover the CMP stopping patterns;
   etching the insulating material layer using a CMP process until the CMP stopping patterns become exposed;
   further etching the insulating material layer using a wet or dry etching process and using the CMP stopping patterns as an etch stop; and
   removing the CMP stopping patterns after said further etching.

15. The method of claim 14, wherein the CMP stopping patterns are not damaged during said further etching.

16. The method of claim 14, wherein the CMP stopping patterns comprise a silicon nitride and said further etching comprises a wet etching using an HF wet etching solution.

17. The method of claim 14, wherein said further etching comprises etching the insulating material layer down to a level below an upper surface of the CMP stopping patterns and above an upper surface of the semiconductor substrate.

* * * * *